(12) United States Patent
Manabe (10) Patent No.: US 7,786,537 B2
(45) Date of Patent: Aug. 31, 2010

(54) SEMICONDUCTOR DEVICE AND METHOD FOR MANUFACTURING SAME

(75) Inventor: Kenzo Manabe, Tokyo (JP)

(73) Assignee: NEC Corporation, Tokyo (JP)

( * ) Notice: Subject to any disclaimer, the term of this patent is extended or adjusted under 35 U.S.C. 154(b) by 214 days.

(21) Appl. No.: 12/093,192

(22) PCT Filed: Oct. 24, 2006

(86) PCT No.: PCT/JP2006/321104

§ 371 (c)(1),
(2), (4) Date: May 9, 2008

(87) PCT Pub. No.: WO2007/055095

PCT Pub. Date: May 18, 2007

(65) Prior Publication Data

US 2009/0114993 A1 May 7, 2009

(30) Foreign Application Priority Data

Nov. 14, 2005 (JP) .............................. 2005-328707

(51) Int. Cl.
*H01L 31/062* (2006.01)
*H01L 21/8238* (2006.01)
(52) U.S. Cl. ...................... 257/384; 438/581
(58) Field of Classification Search .................. 257/339, 257/349, 382–384; 438/543, 581; 257/E21.438–E21.439
See application file for complete search history.

(56) References Cited

U.S. PATENT DOCUMENTS 6,727,129 B1 * 4/2004 Nakajima .................. 438/197
7,592,674 B2 * 9/2009 Takahashi et al. ........... 257/369

FOREIGN PATENT DOCUMENTS

| JP | 62-104174 | 5/1987 |
|----|-----------|--------|
| JP | 2004-228351 | 8/2004 |
| JP | 2004-253797 | 9/2004 |
| JP | 2005-268272 | 9/2005 |
| JP | 2005-294360 | 10/2005 |

(Continued)

OTHER PUBLICATIONS

Takahashi et al., Dual workfunction Ni-Silicide/ HfSiON gate stacks by phase-controlled full-silicidation (PC-FUSI) technique for 45 nm-node LSTP and LOP devices': Electron Devices Meeting, 2004. IEDM Technical Digest. IEEE INternational : Dec. 13, 2004, p. 91-94, full text, Fig. 1-11.

(Continued)

*Primary Examiner*—Calvin Lee
(74) *Attorney, Agent, or Firm*—Young & Thompson (57) ABSTRACT

A semiconductor device includes a silicon substrate; a P channel type field effect transistor including a first gate insulating film on the substrate, a first gate electrode on the first gate insulating film and a first source/drain region; and an N channel type field effect transistor including a second gate insulating film on the substrate, a second gate electrode on the second gate insulating film and a second source/drain region. The entire first gate electrode is made of a metal silicide, and at least in an upper portion including the upper surface of the second gate electrode, a silicide region of the same kind as the metal (M) is provided. The metal concentration in the silicide region is lower than that in the silicide of the first gate electrode. In an upper portion including the upper surface of the second gate electrode, there is a barrier layer region containing a metal diffusion suppressing element at a concentration higher than that in the lower portion.

12 Claims, 5 Drawing Sheets

FOREIGN PATENT DOCUMENTS

| | | |
|---|---|---|
| JP | 2006-140319 | 6/2006 |
| WO | WO 2006/001271 | 6/2005 |

OTHER PUBLICATIONS

Aime et al. Work function tuning through dopant scanning and related effects in Ni Electron Devices Meeting, 2004. IEDM Tchnical Digest. IEEE International : 2004. IEDM Technical Digest. IEEE INternational : Dec. 13, 2004, p. 87-90, full text Fig. 1-20.

"Turnable Work Function Dual Metal Gate Technology for Bulk and Non-Bulk CMOS", JaeHoon Lee et al., 14.2.1-14.2.4, 0-7803-7462-2002 IEEE, Dept of Electrical Engineering, North CArolina State University, Raleigh, NC 27695, USA.

"Demonstration of Fully Ni-Silicided Metal GAtes on $Hfo_2$ based high-k gate dielectrics as a candidate for low power applications, K.G Anil et al., p. 190-191, 2004 Symposium on VLSI Technology" Digest of Technical Papers.

\* cited by examiner

SEMICONDUCTOR DEVICE AND METHOD FOR MANUFACTURING SAME

TECHNICAL FIELD

The present invention relates to a semiconductor device and a method for manufacturing the same, more particularly to a semiconductor device including a MOS field effect transistor (Metal Oxide Semiconductor Field Effect Transistor: MOSFET) having a gate electrode made of a metal silicide and a method for manufacturing the semiconductor device.

BACKGROUND ART

Recent development of leading-edge CMOS (complementary MOS) devices with advancing miniaturization of transistors has encountered a problem of driving current degradation caused by depletions of gate electrodes. For the purpose of improving driving performance, a technology using metallic materials instead of traditional polycrystalline silicon, so called a metal gate technology, is being studied.

On the other hand, the miniaturization of the transistors requires thinning of gate insulating films, which causes an increase of gate leakage currents. For the purpose of reducing power consumption, the use of high dielectric constant materials (High-k material) to physically thicken the gate insulating film is being studied to reduce the gate leakage currents.

Materials of metal gate electrodes under consideration include pure metal and metal nitride or silicide materials and so on. Any material is required: (1) not to cause degradation of the gate insulating film at the time of the metal gate electrode formation; and (2) to allow threshold voltages (Vth) of an N-type MOSFET and a P-type MOSFET to be set to appropriate values.

In order to achieve a threshold voltage of ±0.5 eV or less in a CMOS transistor, the gate electrode is required to be made of a material having a work function equal to the midgap (4.6 eV) of Si or less, more desirably 4.4 eV or less, in the N-type MOSFET, and a material having a work function equal to the midgap (4.6 eV) of Si or more, more desirably 4.8 eV or more, in the P-type MOSFET.

As a means of realizing these requirements, a method for controlling Vth of a transistor (Dual metal gate technology) has been proposed in which the gate electrode of the N-type MOSFET and the gate electrode of the P-type MOSFET are made of a different metal or alloy having an optimal work function for each and are made through different processes, respectively.

For example, non-patent document 1 (International electron devices meeting technical digest 2002, p. 359) states that Ta and Ru formed on $SiO_2$ have work functions of 4.15 eV and 4.95 eV, respectively, and the work function can be modulated by 0.8 eV between these two electrodes.

However, the dual metal gate technology requires individual formation of metal layers made of different kinds of metals or alloy having different work functions on a substrate and involves a process of removing the metal layer deposited on a gate insulating film of either P-type MOSFET or N-type MOSFET by etching technique. During the etching removal, the gate insulating film is degraded in quality, and consequently, the characteristics and reliability of the device are impaired.

On the other hand, a technique relating to a silicide gate electrode obtained by fully siliciding an electrode pattern of polycrystalline silicon with Ni has been proposed. In this technique, the electrode pattern of the polycrystalline silicon can be silicided through a salicide process after a high-temperature heat treatment for activating impurities in a source/drain diffusion region of a CMOS. This technique provides good compatibility with typical CMOS processes and does not require etching removal of deposited films on the gate insulating film, which is necessary in the dual metal gate technology, therefore preventing damage to the gate insulating film.

Especially, non-patent document 2 (International electron devices meeting technical digest 2004, p. 91) discloses that a MOSFET, including a HfSiON high dielectric constant film used as a gate insulating film and a fully silicided Ni silicide electrode used as a gate electrode, can control its wide-ranging effective work function by controlling the composition of the Ni silicide through the use of crystal phase formation. In addition, non-patent document 2 states that a threshold voltage of ±0.3 V is feasible by means of the formation of $Ni_3Si$ phase, NiSi phase and $NiSi_2$ phase.

DISCLOSURE OF THE INVENTION

The object of the present invention, in view of the above background art, is to provide a semiconductor device with high performance and reliability and a simple method for manufacturing the semiconductor device.

According to the present invention, the following semiconductor device and method for manufacturing the semiconductor device are provided.

(1) A semiconductor device comprising:

a silicon substrate;

a P channel type field effect transistor including a first gate insulating film on the silicon substrate, a first gate electrode on the first gate insulating film and a first source/drain region; and an N channel type field effect transistor including a second gate insulating film on the silicon substrate, a second gate electrode on the second gate insulating film and a second source/drain region, wherein the first gate electrode is entirely made of a silicide of metal M, and the second gate electrode comprises a silicide region of the same kind of metal as the metal M at least in an upper portion of the second gate electrode including its upper surface, the concentration of the metal M in the silicide region is lower than that of the metal M in the silicide of the first gate electrode, and a barrier layer region in an upper portion including the upper surface of the second gate electrode, the barrier layer region containing a metal diffusion suppressing element at a concentration higher than that in the lower portion.

(2) The semiconductor device according to item 1, wherein the metal diffusion suppressing element is an element selected from the group consisting of a nitrogen atom, a fluorine atom and an oxygen atom.

(3) The semiconductor device according to item 1, wherein the metal diffusion suppressing element is a nitrogen atom.

(4) The semiconductor device according to any one of items 1 to 3, wherein the barrier layer region has a thickness, perpendicular to the substrate, of from 1 to 10 nm, and a concentration of the metal diffusion suppressing element of from 0.1 to 10 at. %.

(5) The semiconductor device according to any one of items 1 to 4, wherein the metal M is an element selected from the group consisting of nickel, platinum, palladium, cobalt and vanadium.

(6) The semiconductor device according to any one of items 1 to 5, wherein the gate electrode of the N channel type field effect transistor is entirely made of a silicide.

(7) The semiconductor device according to any one of items 1 to 4 wherein the gate electrode of the P channel type field effect transistor is made of a silicide expressed by $Ni_xSi_{1-x}$ ($0.55 \leq x<1$), and the gate electrode of the N channel type field effect transistor is made of a silicide expressed by $Ni_xSi_{1-x}$ ($0<x<0.55$).

(8) The semiconductor device according to item 7, wherein the gate electrode of the P channel type field effect transistor is made of a silicide mainly containing $Ni_3Si$ phase, and the gate electrode of the N channel type field effect transistor is made of a silicide mainly containing NiSi phase or $NiSi_2$ phase.

(9) The semiconductor device according to any one of items 1 to 8, wherein the gate electrode of the N channel type field effect transistor has a height, perpendicular to the substrate, greater than the height, perpendicular to the substrate, of the gate electrode of the P channel type field effect transistor.

(10) The semiconductor device according to any one of items 1 to 9, wherein the first insulating film and the second insulating film comprise a high dielectric constant insulating film adjoining the gate electrode.

(11) The semiconductor device according to any one of items 1 to 9, wherein the first insulating film and the second insulating film comprise a laminated structure of a silicon oxide film or a silicon oxynitride film and a high dielectric constant insulating film adjoining the gate electrode.

(12) The semiconductor device according to item 10 or 11, wherein the high dielectric constant insulating film contains hafnium.

(13) A method for manufacturing a semiconductor as mentioned in item 1 comprising:
preparing a silicon substrate including a P-type active region and an N-type active region;
forming an insulating film to be a gate insulating film on the silicon substrate;
forming a gate silicon film on the insulating film;
forming a gate pattern by processing the gate silicon film;
forming source/drain regions;
forming a metal layer on the gate pattern;
selectively irradiating a metal diffusion suppressing element to the metal film in a region in which the N channel type field effect transistor is formed;
forming gate electrodes by performing a heat treatment for siliciding the gate pattern; and
removing remaining metal being not silicided, of the metal film.

(14) The method for manufacturing the semiconductor device according to item 13, wherein the metal diffusion suppressing element is selected from the group consisting of a nitrogen atom, a fluorine atom and an oxygen atom.

(15) The method for manufacturing the semiconductor device according to item 13, wherein the metal diffusion suppressing element is a nitrogen atom.

(16) The method for manufacturing the semiconductor device according to any one of items 13 to 15, wherein the metal film is a metal film selected from the group consisting of nickel, platinum, palladium, cobalt and vanadium.

(17) The method for manufacturing the semiconductor device according to any one of items 13 to 16, wherein the metal diffusion suppressing element is irradiated by a plasma irradiation method or an ion implantation method.

(18) The method for manufacturing the semiconductor device according to any one of items 13 to 17, wherein the metal concentration of the silicide formed in the N-type active region during the heat treatment is controlled by adjusting the thickness of the metal film, and the metal concentration of the silicide formed in the P-type active region during the heat treatment is controlled by adjusting the amount of irradiation of the metal diffusion suppressing element.

In the instant specification, the "high dielectric constant (High-k) insulating film" is used to draw a distinction from an insulating film made of silicon dioxide ($SiO_2$), which is conventionally used as a general gate insulating film, and has a higher dielectric constant than that of the silicon dioxide, but the value of the dielectric constant is not specifically limited.

In the instant specification, the "effective work function" of the gate electrode is generally obtained from a flat band voltage by a CV measurement, and is affected by, in addition to the work function inherent in the gate electrode, a fixed charge in the insulating film, a dipole formed at the interface, Fermi level pinning and so on. The effective work function is distinguished from the "work function" inherent in the material making up the gate electrode.

In the instant specification, the "MOS" (Metal Oxide Semiconductor) means a laminated structure of a conductor, insulator and semiconductor. The conductor and insulator are not limited to a single metal and silicon dioxide, respectively.

The present invention can provide a semiconductor device with high performance and reliability and a simple method for manufacturing the semiconductor device.

BEST MODE FOR CARRYING OUT THE INVENTION

The present invention is preferable for semiconductor devices comprising a P channel type field effect transistor (hereinafter referred to as "PMOS") and N channel type field effect transistor (hereinafter referred to as "NMOS"), especially for CMOS devices. In a semiconductor device in accordance with the present invention, the gate electrode of a PMOS and the gate electrode of an NMOS contain the same kind of metal and comprise silicides different in their composition, and the threshold voltages (Vth) of the PMOS and NMOS are controlled to be appropriate values, The present invention is mainly characterized in that the gate electrode of the NMOS, in the above semiconductor device, includes a barrier layer region, which contains a metal diffusion suppressing element, in the upper portion including the upper surface of the gate electrode. The provision of the barrier layer region can suppress compositional changes caused by interface reaction between the gate electrode and a contact wire and thus suppress the threshold voltage variations. As the semiconductor device becomes denser, a channel section and contact section are disposed closely to each other. In addition, the reduction of the gate size (especially height) accompanied with miniaturization of the semiconductor device helps the compositional change, which is caused by the interface reaction, more often affect the threshold voltage. The present invention has an advantage especially for such a high-density, miniaturized semiconductor device.

In order to control the threshold voltage, if the metal concentration of the silicide used in the gate electrode of the NMOS is set to be lower than that of the gate electrode of the PMOS, or if the gate electrode of the NMOS is made with a low-metal-concentration silicide region and a conductive silicon region made of a silicon gate material, the low-metal-concentration silicide and the silicon gate material are likely to spur the compositional change caused by the interface reaction, and accordingly the threshold voltage is likely to vary. To prevent this, an effective solution is to provide a barrier layer region on the gate electrode, in which the low-metal-concentration silicide is formed, of the NMOS. In a case where the silicide of the gate electrode is formed by siliciding the silicon gate material, a high-metal-concentration silicide extends the height (a length perpendicular to a substrate) of the gate electrode of the PMOS due to its large amount of metal content, while a low-metal-concentration silicide relatively decreases the height of the gate electrode of the NMOS due to its small amount of metal content. Such a short gate electrode of the NMOS is likely to affect the threshold voltage by the compositional change owing to the interface reaction in comparison with the gate electrode of the PMOS. Also from this point of view, the provision of the barrier layer region to the gate electrode of the NMOS is effective. The structure in which the gate electrode of the NMOS has the barrier layer region can be readily realized by the following manufacturing method according to the present invention.

The manufacturing method of the present invention is mainly characterized by forming a metal film on a gate pattern made of a silicon gate material, and, in a step of performing a heat treatment for silicidation to form the gate electrode having a silicide region, selectively irradiating a metal diffusion suppressing element to the NMOS region part of the metal film and subsequently performing a heat treatment for silicidation.

The metal diffusion suppressing element irradiated to the NMOS region part of the metal film forms a barrier layer region, during the heat treatment, which suppresses metal atoms to diffuse from the metal film to the silicon gate material and the formed silicide. This diffusion suppressing effect can be adjusted by irradiance level (e.g., irradiation time) of the metal diffusion suppressing element to control the composition and thickness of the silicide in the NMOS region. On the other hand, in the PMOS region to which no metal diffusion suppressing element is irradiated, a large amount of metal atoms, in comparison with those in the NMOS region, are diffused to the silicon gate material and the formed silicide according to the thickness of the metal film, and a silicidation reaction then occurs. According to the manufacturing method of the present invention, the composition of the silicide of the PMOS gate can be controlled by adjusting the thickness of the metal film in the PMOS region, while the composition of silicide of the NMOS gate can be controlled by adjusting the irradiance level of the metal diffusion suppressing element to the NMOS region. In short, the silicide compositions in the NMOS region and PMOS region can be individually controlled, and therefore it is possible to readily manufacture a high-performance semiconductor device that can be controlled to have desired threshold voltages. In addition, the aforementioned barrier layer region can be formed at the upper portion of the gate electrode of the NMOS, thereby manufacturing a semiconductor device with improved yield and high reliability.

Figure 1:
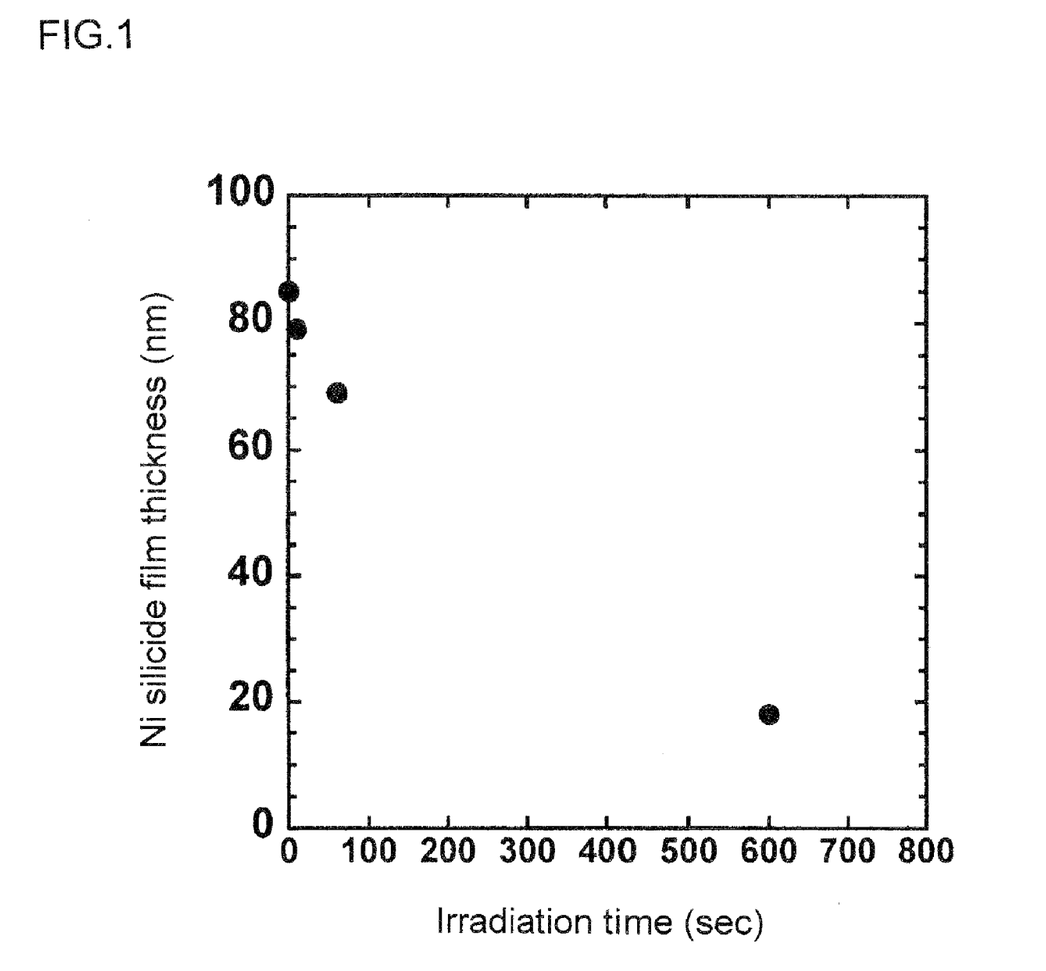
FIG. 1 illustrates the thickness variations of a silicide region with respect to nitrogen plasma irradiation time.
Figure 2:
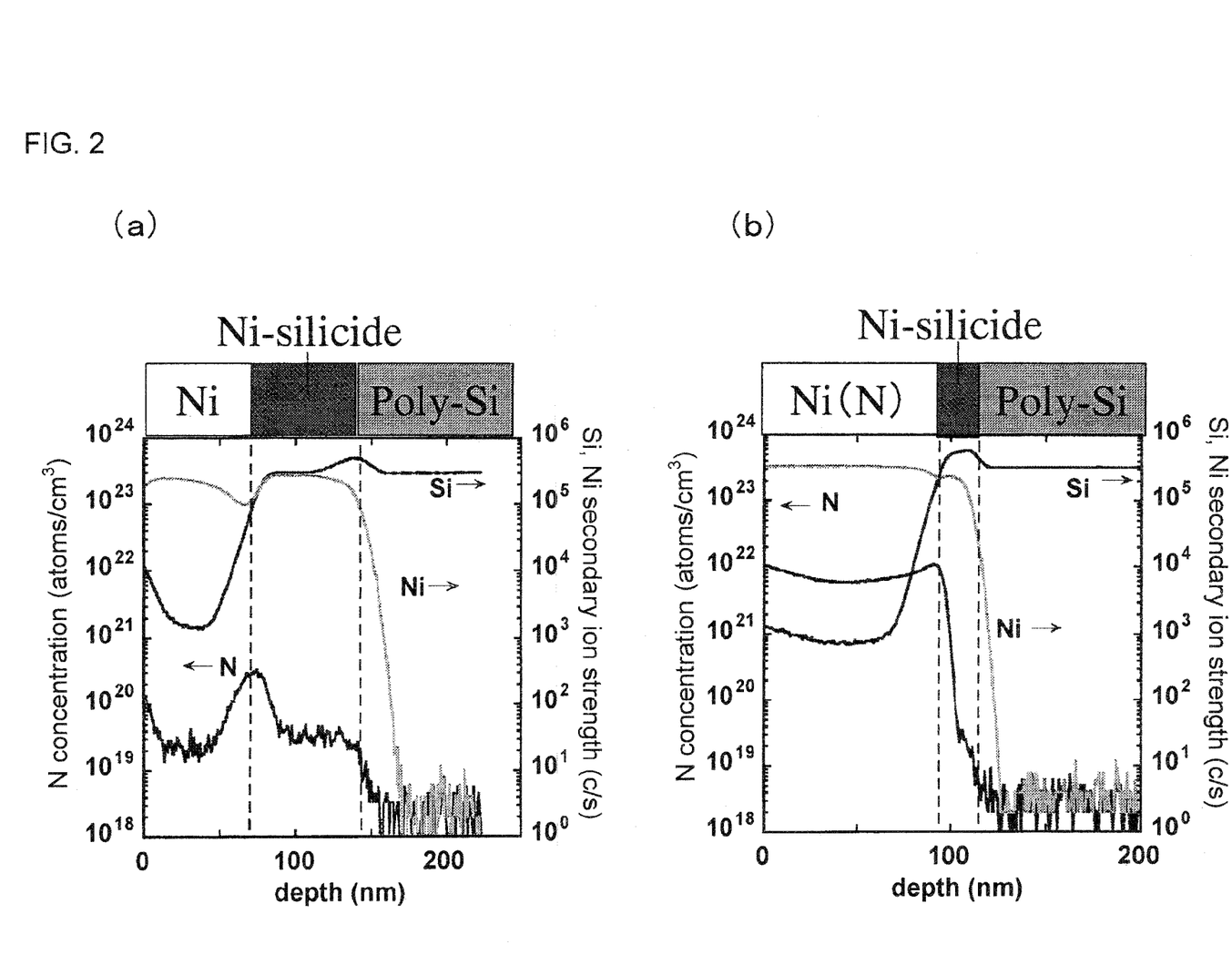
FIG. 2 illustrates the distribution of compositions in the thickness direction (depth direction) according to silicidation (without nitrogen plasma irradiation in FIG. 2(a), with nitrogen plasma irradiation in FIG. 2(b))

FIGS. 1 and 2 show measurement results when silicidation is performed with nitrogen atoms (N) as a metal diffusion suppressing element and nickel (Ni) as a siliciding metal. FIG. 1 shows variations of the thickness (a length perpendicular to a substrate) of a silicide film with respect to the irradiation time of nitrogen plasma. FIG. 2 illustrates compositional distributions in the depth direction (in a direction perpendicular to a substrate) after silicidation: without the nitrogen plasma irradiation in FIG. 2(a); and with the nitrogen plasma irradiation (irradiation time: 10 minutes) in FIG. 2(b). The measurement of the compositional distribution was made through an SIMS analysis (Secondary Ion Mass Spectrometry). The silicidation was performed as follows. On a silicon substrate, a silicon oxide film (90 nm in thickness), a polycrystalline silicon (poly-Si) film (150 nm in thickness) and a Ni film (90 nm in thickness) were formed in this order. Next, the nitrogen plasma was irradiated on the Ni film for from 10 seconds to 10 minutes under nitrogen atmosphere (nitrogen pressure of 0.8 Pa), at a RF power of 400 W. Then, a heat treatment was performed at 280° C. for 18 minutes and 20 seconds.

As apparent from FIG. 1, it is found that the thickness of the silicide film can be controlled according to the irradiation time of the nitrogen plasma. The results also demonstrate that the amount of diffusion of the nickel atoms from the Ni region to the silicide region and polycrystalline silicon region can be controlled.

It is apparent from FIGS. 2(a) and 2(b) that in the case of the nitrogen plasma irradiation there is a nitrided region in the silicide region near the interface (corresponding to the upper surface of the gate electrode) between the Ni region and silicide region, and the nitrided region contains high concentrations of nitrogen in comparison with the case where the nitrogen plasma irradiation is not performed. It is probably that this nitrided region functions as a barrier layer region and suppresses the nickel atoms to diffuse from the Ni region to the silicide region and polycrystalline silicon region.

The gate insulating film suitable for the above-described semiconductor device in accordance with the invention can be a silicon oxide film, a silicon oxynitride film, a high dielectric constant insulating film, or a lamination film including a silicon oxide film or a silicon oxynitride film and a high dielectric constant insulating film formed thereon. From the viewpoint of reduction of standby power realized by cutting back leakage currents, improvement of reliability by securing physical thickness and control of the threshold voltage in combination with the silicide electrode, the high dielectric constant insulating film or the lamination film including the high dielectric constant insulating film are preferred.

The high dielectric constant insulating film is made of a material having a dielectric constant higher than the dielectric constant (3.9) of silicon dioxide ($SiO_2$), and the possible material is metal oxide, metal silicate, nitrogen-doped metal oxide or nitrogen-doped metal silicate. Nitrogen-doped materials are preferable since they suppress crystallization and accordingly improve reliability. The preferred metal element in the high dielectric constant material is hafnium (Hf) or zirconium (Zr) in consideration of heat resistance of the film and reduction of fixed charge in the film, especially Hf. As the high dielectric constant material, metal oxide containing Hf or Zr and Si is preferable, and metal oxynitride made of the metal oxide and nitrogen is more preferable, that is, HfSiO and HfSiON is more preferable and especially HfSiON is more preferable.

The high dielectric constant insulating film is preferably provided so as to adjoin the gate electrode. The combination of the gate electrode and the high dielectric constant insulating film adjoining thereon allows extensive control of the threshold voltage of a transistor. For the purpose of reducing interface state at the interface between the silicon substrate and gate insulating film and lessening the effect of the fixed charges in the high dielectric constant insulating film, a silicon oxide film or silicon oxynitride film can be provided at the interface between the high dielectric constant insulating film and silicon substrate.

It is preferable for the high dielectric constant insulating film to contain the metal element Mi (e.g., Hf) and Si at a ratio of the atom number Mi/(Mi+Si) of from 0.3 to 0.7. The high dielectric constant insulating film having the ratio of 0.3 or more can effectively reduce leakage currents flowing therethrough during the operation of the device, thereby more adequately decreasing the power consumption. On the other hand, the high dielectric constant insulating film having the ratio of 0.7 or less can ensure its heat resistance and therefore suppress its crystallization during the manufacturing process of the device, thereby preventing the degradation of the performance as a gate insulating film.

The gate electrode in accordance with the present invention has a silicide region to control the threshold voltage and improve conductivity. From the viewpoint of preventing the depletion in the gate electrode and improving the driving performance, it is preferable to silicide the entire gate electrode including the region adjoining the gate insulating film. Especially, from the viewpoint of control of the threshold voltage and improvement of the driving performance, it is preferable to silicide the entire gate electrode of at least the PMOS. Similarly, it is preferable to silicide the entire gate electrode of the NMOS; however, the gate electrode can be structured so as to have an upper portion, including the upper surface, made of a silicide and a lower portion, adjoining the gate insulating film, made of a silicon gate material imparted with conductivity. The gate electrode having the lower portion made of the silicon gate material can improve reliability of the gate insulating film in comparison with the gate electrode made of a silicide. Such a silicon gate material may be polycrystalline silicon or amorphous silicon, or a lamination thereof, and can be imparted with conductivity by doping. The thickness (a length perpendicular to the substrate) of the silicide layer region, which is formed in the gate electrode upper portion including the upper surface of the gate electrode in the NMOS is preferably 10 nm or more, more preferably 20 nm or more and preferably 50 nm or less, more preferably 30 nm or less from the viewpoint of the threshold voltage control and conductivity. The thickness of the polycrystalline silicon layer region formed in the gate electrode lower portion adjoining the gate insulating film in the NMOS is preferably 20 nm or more, more preferably 30 nm or more to achieve a sufficient effect and preferably 150 nm or less, more preferably 100 nm or less from the viewpoint of the threshold voltage control and conductivity.

The gate electrode of the NMOS in accordance with the present invention further comprises a barrier layer region in the upper portion including the upper surface. The barrier layer region contains a higher concentration of the metal diffusion suppressing element than the lower portion of the gate electrode.

The thickness (a length perpendicular to the substrate) of the barrier layer region is preferably 1 nm or more, more preferably 3 nm or more in order to produce a sufficient effect given by the barrier layer region formation. Alternatively, from the viewpoint of the conductivity and manufacturing cost, the thickness is preferably 10 nm or less, more preferably 8 nm or less. This barrier layer region contains the metal diffusion suppressing element at a concentration of preferably 0.1 to 10 at. % (atomic %), more preferably 1 to 10 at. %, still more preferably 1 to 8 at. %. The concentration is preferably in the above ranges from the viewpoint of the effect given by the barrier layer region formation, conductivity and manufacturing cost. This barrier layer region is of course formed in the silicide region of the gate electrode that is entirely made of a silicide; however, even if only the upper portion of the gate electrode is made of the silicide, it is preferable for the barrier layer region to be present in the silicide region from the viewpoint of the conductivity and manufacturing cost.

Nitrogen atoms (N), fluorine atoms (F), or oxygen atoms (O) can be used as the metal diffusion suppressing element. Among these, the nitrogen atoms are the most preferable in consideration of effect of suppressing metal diffusion and the manufacture of devices.

The metal in the silicide making up the gate electrode is metal that can form a silicide through a salicide technology, for example, nickel (Ni), platinum (Pt), palladium (Pd), cobalt (Co) or vanadium (V). Among these, Ni is preferred. Ni can fully make the entire gate electrode into a silicide at a relatively low temperature (in a range from 350 to 500° C.), and therefore can suppress the increase of resistance in the metal silicide formed in the contact region of a source/drain region. In addition, Ni can form both a crystal phase containing a high concentration of Si and a crystal phase containing a high concentration of Ni in such a temperature range. Furthermore, the composition of the Ni silicide is determined in a self-aligned manner in the silicidation to form a gate electrode and the composition is stable, thereby reducing variations from process to process.

The nickel silicide preferred as a silicide making up the gate electrode preferably has a composition expressed by $Ni_xSi_{1-x}$ ($0.55 \leq x \leq 1$) in PMOS and more preferably has a composition satisfying $0.6<x<0.8$; $0.7<x<0.8$ is especially preferable. On the other hand, the nickel silicide in NMOS preferably has a composition expressed by $Ni_xSi_{1-x}$ ($0<x<0.55$), and more preferably has a composition satisfying $0.3<x<0.55$; $0.3<x<0.35$ or $0.45<x<0.55$ is especially preferable. In other words, the preferred silicide of the PMOS mainly contains $Ni_3Si$ phase, while the preferred silicide of the NMOS mainly contains NiSi phase or $NiSi_2$ phase. The crystal phase of the nickel silicide is roughly grouped into $NiSi_2$, NiSi, $Ni_3Si_2$, $Ni_2Si$ and $Ni_3Si$, and the nickel silicide can be made of a mixture thereof. Especially, the composition of the silicide containing $Ni_3Si$ phase, NiSi phase or $NiSi_2$ phase is determined in a self-aligned manner and stable, and also the formation of the silicide containing such a phase is readily made, and therefore variations from process to process can be reduced. Since the effective work function of the nickel silicide on the HfSiON film is approximately 4.8 eV for $Ni_3Si$, approximately 4.5 eV for NiSi and approximately 4.4 eV for $NiSi_2$, it is preferable to apply $Ni_3Si$ for the PMOS, and NiSi or $NiSi_2$ for the NMOS.

The present invention is suitable for miniscule semiconductor devices with a gate electrode having a height (a length perpendicular to the substrate) of 200 nm or less, more preferably 150 nm or less; 100 nm or less is especially preferable. On the other hand, from the viewpoint of securing operating performance and manufacturing accuracy, the height of the gate electrode is preferably 30 nm or more, more preferably 40 nm or more. The gate length can be set in a range, for example, from 10 to 100 nm.

Next, a preferred exemplary embodiment of the present invention will be described with reference to drawings.

FIGS. 3a to 3h are cross-sectional schematic views illustrating steps of a method for manufacturing a semiconductor device according to the present invention.

Figure 3A:
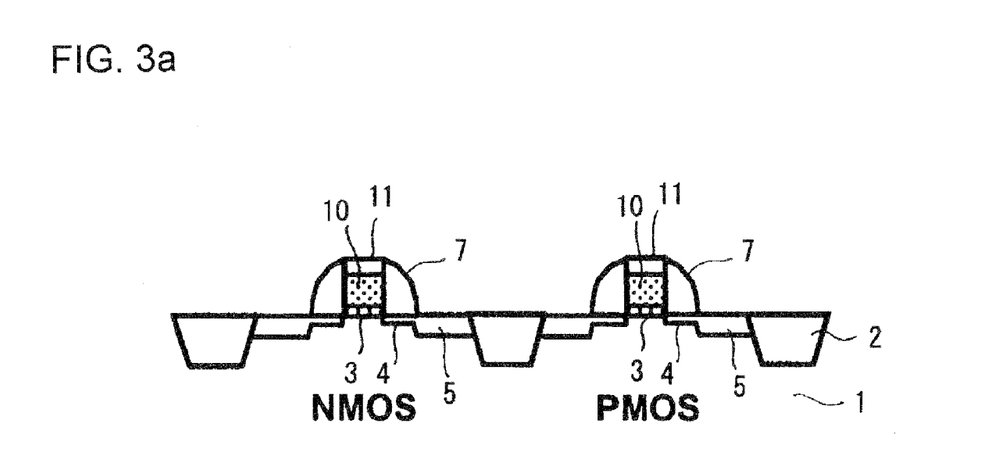
FIG. 3a is a cross-sectional view illustrating a step in a method for manufacturing a semiconductor device according to the present invention.

First, a silicon substrate 1 having element isolation regions 2 formed through an STI (Shallow Trench Isolation) technique, a P-type active region and an N-type active region are prepared.

Next, a gate insulating film 3 is formed on a surface of the silicon substrate. The gate insulating film of the exemplary embodiment is made of a silicon oxide film and HfSiON film. This HfSiON film in the gate insulating film is a region in which the concentration of Hf varies along the depth direction (in a direction perpendicular to the substrate) such that the concentration of Hf is highest near the interface between the gate electrode and gate insulating film and decreases toward the silicon substrate, and the average ratio of the number of Hf atoms in the HfSiON film Hf/(Hf+Si) is 0.5. The silicon oxide film in the gate insulating film is a silicon thermally-oxidized film ($SiO_2$ film) region near the interface between the silicon substrate and gate insulating film. Such a gate insulating film can be formed as follows. First, a silicon thermally-oxidized film of 2 nm in thickness is formed, and then a hafnium (Hf) film of 0.5 nm in thickness is deposited by a long throw sputtering method. Next, the silicon thermally-oxidized film having the hafnium (Hf) film thereon undergoes a two-step heat treatment including a step performed in oxygen at 500° C. for 1 minute and a subsequent step performed in nitrogen at 800° C. for 30 seconds, and thus the Hf is diffused into the base silicon thermally-oxidized film by solid-phase diffusion so as to leave the $SiO_2$ film at a region adjoining the silicon substrate, thereby forming the HfSiO film. Subsequently, nitridation anneal is performed in an atmosphere of $NH_3$ at 900° C. for 10 minutes to obtain a HfSiON film of approximately 2 nm in thickness.

Next, a polycrystalline silicon film 10 of 60 nm in thickness is deposited on the gate insulating film by a CVD (Chemical Vapor Deposition) method, and then a silicon oxide film 11 of 20 nm in thickness is formed to use as a mask. Instead of the polycrystalline silicon film, an amorphous silicon film or a lamination film including a polycrystalline silicon film and amorphous silicon film can be used.

Next, the lamination film (gate insulating film 3, polycrystalline silicon film 10 and silicon oxide film 11) on the silicon substrate is patterned to form a gate pattern using a lithography technique and RIE (Reactive Ion Etching) technique. Subsequently, while one of either NMOS region or PMOS region is masked, the other region is ion-implanted with the gate pattern as a mask to form extension diffuse regions 4 in a self-aligned manner. This step is individually performed for the NMOS region and PMOS region.

Next, a silicon oxide film is deposited by a CVD method so as to cover the gate pattern and then the silicon oxide film is etched back to form gate sidewalls 7. Subsequently, while one of either NMOS region or PMOS region is masked, the other region is again implanted with ion to form source/drain diffused regions 5. This step is individually performed for the NMOS region and PMOS region. The source/drain diffused regions are activated later by applying a heat treatment.

The above-described steps result in the structure shown in FIG. 3a.

Figure 3B:
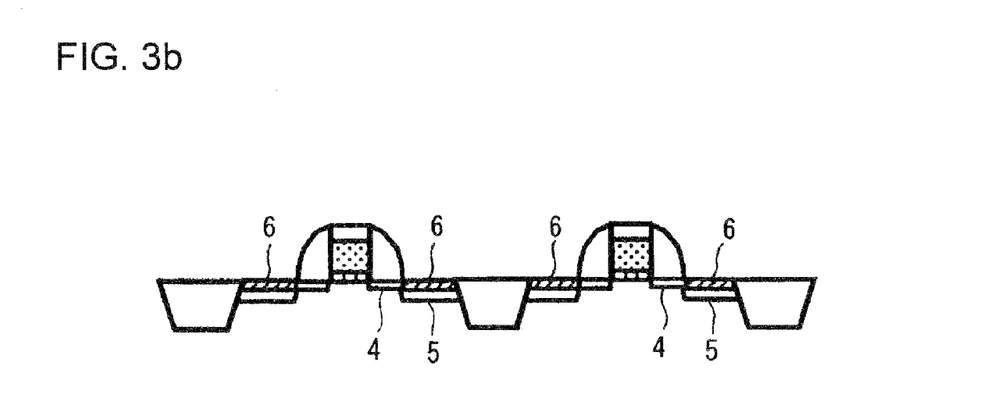
FIG. 3b is a cross-sectional view illustrating a step in the method for manufacturing the semiconductor device according to the present invention.

Next, a nickel film is deposited on the entire surface by sputtering, and then, as shown in FIG. 3b, nickel silicide layers 6 are formed only on the source/drain diffused regions, by salicide technology, using the gate pattern, gate sidewalls and element isolation regions as masks. In the exemplary embodiment, nickel monosilicide (NiSi) layers capable of minimizing the contact resistance are formed as the nickel silicide layers 6. Instead of the Ni monosilicide layers, Co silicide layers or Ti silicide layers can be formed.

Figure 3C:
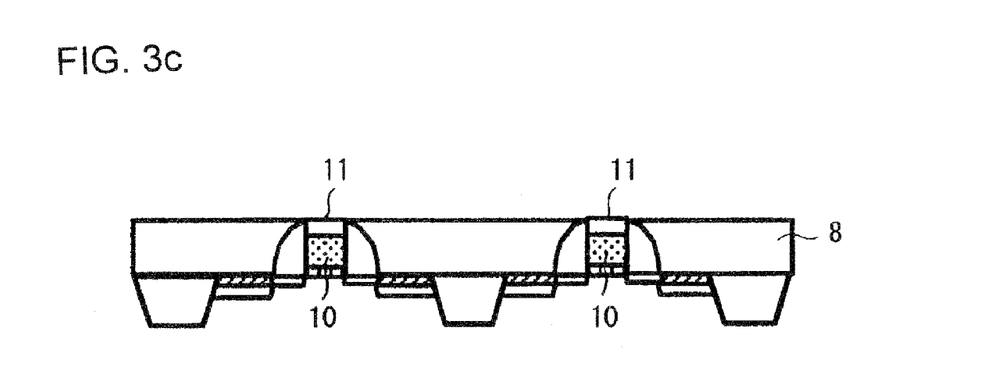
FIG. 3c is a cross-sectional view illustrating a step in the method for manufacturing the semiconductor device according to the present invention.

Next, interlayer insulating film 8 made of silicon oxide is formed so as to bury the gate pattern by the CVD method. Then, as shown in FIG. 3c, the surface of the interlayer insulating film 8 is planarized by a CMP (Chemical Mechanical Polishing) technique.

Figure 3D:
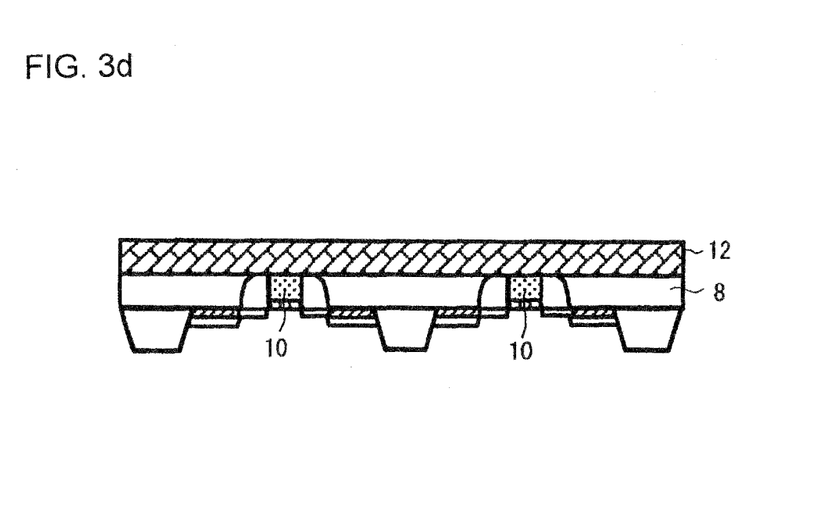
FIG. 3d is a cross-sectional view illustrating a step in the method for manufacturing the semiconductor device according to the present invention.

Next, the interlayer insulating film is etched back so as to remove the silicon oxide films 11, which are an upper layer of the gate pattern, and thereby exposing the polycrystalline silicon films 10. Subsequently, as shown in FIG. 3d, a metal film 12 is formed on the entire surface in order to silicide the polycrystalline silicon films 10 of the gate electrode pattern. In the exemplary embodiment, a nickel film is formed as the metal film 12.

The thickness of the metal film is set to a thickness so that the entire polycrystalline silicon films 10 at least in the PMOS region can be silicided by a subsequent heat treatment for silicidation. In the case where a nickel film is formed as the metal film, it is preferable to set the thickness of the metal film so that the silicide of the gate electrode in the PMOS region has a composition expressed by $Ni_xSi_{1-x}$ ($0.55 \leqq x<1$), preferably has a composition satisfying $0.6<x<0.8$, more preferably a composition satisfying $0.7<x<0.8$, and still more preferably has a composition mainly containing $Ni_3Si$ phase. The $Ni_3Si$ phase can be readily formed by setting the ratio of thickness t1 of the nickel film used for silicidation to thickness T of the polycrystalline silicon film of the gate pattern to fall within a range of $t1/T \geqq 1.6$. In the present exemplary embodiment in which the thickness of the polycrystalline silicon film 10 is set to 60 nm, the thickness of the metal film 12 can be set to 100 nm or more, for example, 120 nm.

Figure 3E:
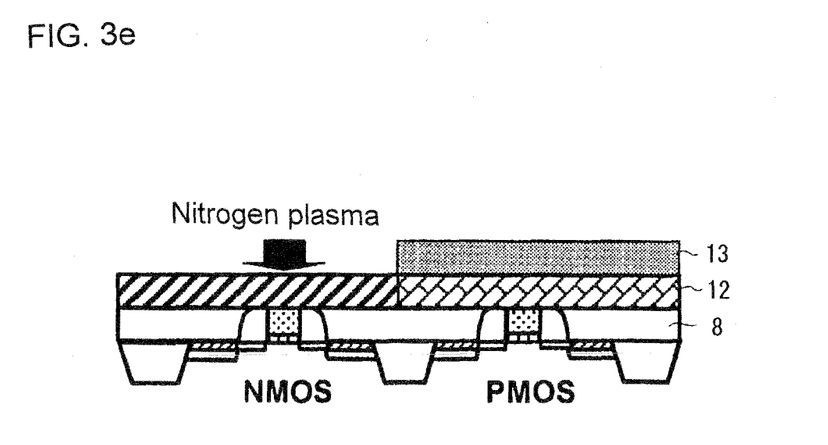
FIG. 3e is a cross-sectional view illustrating a step in the method for manufacturing the semiconductor device according to the present invention.

Next, as shown in FIG. 3e, a mask 13 is provided in the PMOS region by using a lithography technique so as to expose only the NMOS region. Subsequently, a metal diffusion suppressing element is irradiated to the entire surface to be introduced into the exposed metal film in the NMOS region. In the present exemplary embodiment, nitrogen plasma is irradiated. Instead of the plasma irradiation, ion implantation can introduce the metal diffusion suppressing element. Then, the irradiation of the metal diffusion suppressing element is controlled so as not to pass through the metal film 12 and not to reach the polycrystalline silicon film 10, that is, the irradiation conditions are adjusted such that the metal diffusion suppressing element remains in the metal film. In addition, it is preferable to perform the irradiation under an inert atmosphere, more preferably in an atmosphere of nitrogen from the viewpoint of preventing metal oxidation.

As described with FIG. 1, the degree of silicidation obtained by the subsequent heat treatment can be adjusted according to the irradiation time of the metal diffusion suppressing element. The irradiation time is set so that the silicided region can have a predetermined thickness and a predetermined silicide composition in the heat treatment for silicidation. The adjustment of the irradiation time enables the formation of silicide having the aforementioned composition in the PMOS region, while siliciding the entire polycrystalline silicon film 10 in the NMOS region and making the composition of the silicide be $Ni_xSi_{1-x}$ (0<x<0.55), preferably making the composition satisfy 0.3<x<0.55, especially making the composition satisfy 0.3<x<0.35 or 0.45<x<0.55, and in other words, making the composition mainly contain NiSi phase or $NiSi_2$ phase. Extending the irradiation time of the metal diffusion suppressing element reduces the amount of nickel diffusion, thereby lowering the metal concentration in the silicide. It is also possible not to silicide the lower region, which adjoins the gate insulating film, to leave the polycrystalline silicon region. In the case of leaving the polycrystalline silicon region, for example, the NMOS region part of the polycrystalline silicon film is doped to impart conductivity prior to the formation of the metal film.

Figure 3F:
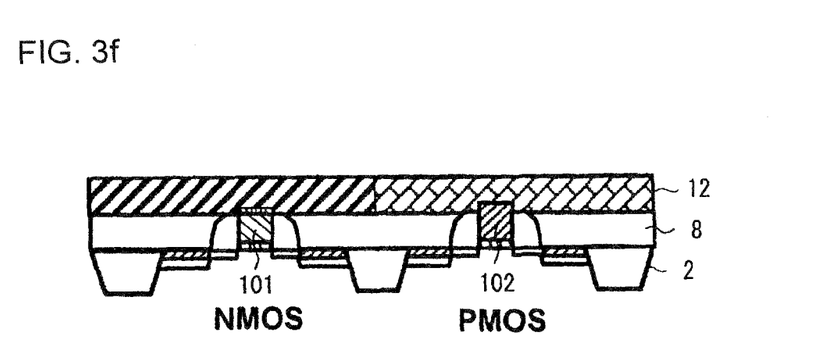
FIG. 3f is a cross-sectional view illustrating a step in the method for manufacturing the semiconductor device according to the present invention.

Next, a heat treatment for silicidation is performed after removal of the mask 13 to silicide the polycrystalline silicon film 10, and the gate electrode 101 of the NMOS and the gate electrode 102 of the PMOS are formed (FIG. 3f). This heat treatment is preferably performed in an inert atmosphere for the purpose of preventing oxidation of the metal film 12. Still, this heat treatment needs to be performed at a temperature achieving a diffusion rate enough to silicide the entire polycrystalline silicon film 10 at least in the PMOS region to the extent of the gate insulating film as well as at a temperature which does not make the silicide layers 6 formed on the source/drain diffused regions 5 be high resistant. Since both the silicide of the silicide layers 6 formed on source/drain diffused regions 5 and the silicide of the gate pattern are made of nickel silicide in the present exemplary embodiment, the heat treatment conditions can be set as follows: in an atmosphere of nitrogen gas; at 350 to 500° C.; and for 1 to 20 minutes, for example the heat treatment can be performed at 400° C. for 2 to 5 minutes. If the silicide layers 6 formed on the source/drain diffused regions 5 are made of Co silicide or Ti silicide, the heat treatment in a higher temperature range, for example up to approximately 800° C., is permissible.

Figure 3G:
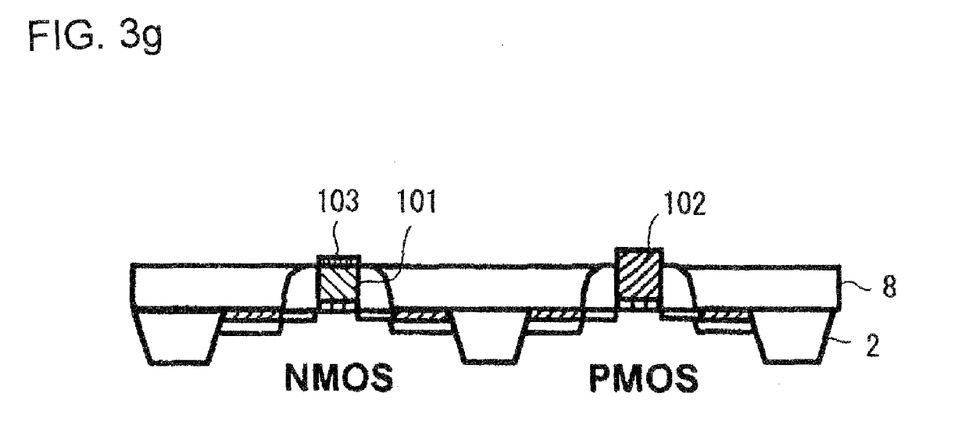
FIG. 3g is a cross-sectional view illustrating a step in the method for manufacturing the semiconductor device according to the present invention.

Next, the remaining metal film 12, which is not silicided in the heat treatment, is removed by wet etching as shown in FIG. 3g. If the metal film 12 is made of a nickel film, the nickel film can be readily removed by using a mixed solution of sulfuric acid and hydrogen peroxide solution without damaging the gate electrode.

Figure 3H:
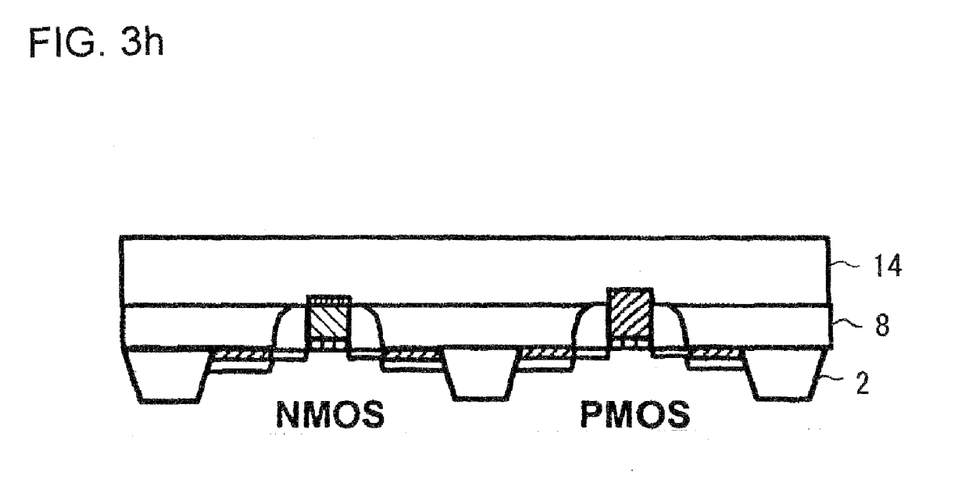
FIG. 3h is a cross-sectional view illustrating a step in the method for manufacturing the semiconductor device according to the present invention.

After formation of an interlayer insulating film 14 and planarization thereof by CMP as shown in FIG. 3h, a step of forming contact wires is performed according to a regular method. From then on, desired semiconductor devices can be formed according to commonly-used processes.

In the present exemplary embodiment, silicidation proceeds to the region adjoining the gate insulating film in the PMOS region during the heat treatment for silicidation. Then, the amount of metal supply can be changed according to the thickness of the metal film 12, and therefore the composition of the silicide can be controlled by adjusting the thickness of the metal film. On the other hand, as described by referring to FIG. 2, the barrier layer region 103, which includes a metal diffusion suppressing element (N) irradiated to the metal film 12, a metal element (Ni) in the metal film and silicon (Si), is formed in the vicinity of the interface between the metal film and gate electrode in the NMOS region. This barrier layer region 103 suppresses the metal to diffuse from the metal film 12 to the polycrystalline silicon film 10 and the formed silicide region. The extent of the diffusion can be adjusted according to the irradiation time, thereby controlling the composition of the silicide in the NMOS region.

According to the manufacturing method of the above exemplary embodiment, the gate electrode 101 of the NMOS has a barrier layer region 103 in its upper portion including the upper surface and a silicide layer in its lower portion made of NiSi single phase (the ratio of the atom number Ni/(Ni+Si) of approximately 0.5), while the gate electrode 102 of the PMOS is made of $Ni_3Si$ single phase (the ratio of the atom number Ni/(Ni+Si) of approximately 0.75). When the gate electrode of the NMOS is made of $NiSi_2$ phase as a substitute for the NiSi phase, the conditions can be changed so as to readily form the $NiSi_2$ phase, by extending the irradiation time to reduce the amount of Ni diffusion and controlling the temperature for silicidation.

Although the polycrystalline silicon film in the NMOS region is silicided to the region adjoining the gate insulating film in FIGS. 3f and 3g, the region adjoining the gate insulating film can be left as a polycrystalline silicon region without siliciding it. The silicide composition can be evaluated by an X-ray diffraction (XRD) method and a Rutherford backscattering (RBS) method.

In the structure of above-described exemplary embodiment, the gate insulating film can be made of a silicon oxide film or silicon nitride film or a lamination film thereof, and the gate electrode can be doped with a conductive impurity (B, P, As, Sb, etc.). Such a gate electrode can be formed by siliciding a doped polycrystalline silicon film. The introduction of the impurity can adjust the effective work function.

The invention claimed is:

1. A semiconductor device comprising:
    a silicon substrate;
    a P channel type field effect transistor including a first gate insulating film on the silicon substrate, a first gate electrode on the first gate insulating film and a first source/drain region; and
    an N channel type field effect transistor including a second gate insulating film on the silicon substrate, a second gate electrode on the second gate insulating film and a second source/drain region, wherein
    the first gate electrode is entirely made of a silicide of metal M, and
    the second gate electrode comprises
        a silicide region of the same kind of metal as the metal M at least in an upper portion of the second gate electrode including its upper surface, the concentration of the metal M in the silicide region is lower than that of the metal M in the silicide of the first gate electrode, and
        a barrier layer region in an upper portion including the upper surface of the second gate electrode, the barrier layer region containing a metal diffusion suppressing element at a concentration higher than that in the lower portion.

2. The semiconductor device according to claim 1, wherein the metal diffusion suppressing element is an element selected from the group consisting of a nitrogen atom, a fluorine atom and an oxygen atom.

3. The semiconductor device according to claim 1, wherein the metal diffusion suppressing element is a nitrogen atom.

4. The semiconductor device according to claim 1, wherein the barrier layer region has a thickness, perpendicular to the substrate, of from 1 to 10 nm, and a concentration of the metal diffusion suppressing element of from 0.1 to 10 at. %.

5. The semiconductor device according to claim 1, wherein the metal M is an element selected from the group consisting of nickel, platinum, palladium, cobalt and vanadium.

6. The semiconductor device according to claim 1, wherein the gate electrode of the N channel type field effect transistor is entirely made of a silicide.

7. The semiconductor device according to claim 1, wherein the gate electrode of the P channel type field effect transistor is made of a silicide expressed by $Ni_xSi_{1-x}$ ($0.55 \leq x < 1$), and the gate electrode of the N channel type field effect transistor is made of a silicide expressed by $Ni_xSi_{1-x}$ ($0 < x < 0.55$).

8. The semiconductor device according to claim 7, wherein the gate electrode of the P channel type field effect transistor is made of a silicide mainly containing $Ni_3Si$ phase, and the gate electrode of the N channel type field effect transistor is made of a silicide mainly containing NiSi phase or $NiSi_2$ phase.

9. The semiconductor device according to claim 1, wherein the gate electrode of the N channel type field effect transistor has a height, perpendicular to the substrate, greater than the height, perpendicular to the substrate, of the gate electrode of the P channel type field effect transistor.

10. The semiconductor device according to claim 1, wherein the first insulating film and the second insulating film comprise a high dielectric constant insulating film adjoining the gate electrode.

11. The semiconductor device according to claim 10, wherein the high dielectric constant insulating film contains hafnium.

12. The semiconductor device according to claim 1, wherein the first insulating film and the second insulating film comprise a laminated structure of a silicon oxide film or a silicon oxynitride film and a high dielectric constant insulating film adjoining the gate electrode.

* * * * *